United States Patent
Kawasaki et al.

(10) Patent No.: US 7,718,976 B2
(45) Date of Patent: May 18, 2010

(54) CHARGED PARTICLE BEAM APPARATUS

(75) Inventors: Takeshi Kawasaki, Musashino (JP); Mitsugu Sato, Hitachinaka (JP); Makoto Ezumi, Mito (JP); Tomonori Nakano, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 294 days.

(21) Appl. No.: 11/762,802

(22) Filed: Jun. 14, 2007

(65) Prior Publication Data
US 2008/0067378 A1    Mar. 20, 2008

(30) Foreign Application Priority Data
Jun. 20, 2006    (JP)    .............................. 2006-169787

(51) Int. Cl.
*G21K 1/08*    (2006.01)
(52) U.S. Cl. .................. 250/396 R; 250/306; 250/307; 250/310; 250/311; 250/396 ML
(58) Field of Classification Search ................. 250/306, 250/307, 310, 311, 396 R, 397, 398, 399, 250/396 ML
See application file for complete search history.

(56) References Cited

U.S. PATENT DOCUMENTS

| | | | | |
|---|---|---|---|---|
| 4,962,313 | A * | 10/1990 | Rose | 250/311 |
| 6,924,488 | B2 * | 8/2005 | Matsuya et al. | 250/396 R |
| 7,015,481 | B2 * | 3/2006 | Matsuya | 250/398 |
| 7,145,154 | B2 * | 12/2006 | Uno | 250/396 R |
| 7,282,722 | B2 * | 10/2007 | Sato et al. | 250/398 |
| 7,355,174 | B2 * | 4/2008 | Sato et al. | 250/310 |

(Continued)

OTHER PUBLICATIONS

H. Rose, Optik, 33, (1971), pp. 1-24.

(Continued)

*Primary Examiner*—David A Vanore
*Assistant Examiner*—Michael Maskell
(74) *Attorney, Agent, or Firm*—Antonelli, Terry, Stout & Kraus, LLP.

(57) ABSTRACT

The present invention provides a stable charged particle beam apparatus to enable high-resolution observation by reducing the influence of the noise of a large number of power supplies used in an aberration corrector. The charged particle beam apparatus that has: an SEM column for irradiating an electron beam onto a specimen and making the electron beam scan it; a specimen chamber for housing a specimen stage on which the specimen is placed and held; a detector for detecting secondary electrons generated by the scanning of the electron beam; display means for displaying an output signal of the detector as an SEM image; and a control unit for controlling component parts including the SEM column, the specimen chamber, and the display means. The SEM column has a pair of accelerating electrodes and an aberration corrector that is placed between the pair of accelerating electrodes and corrects aberration of the electron beam, and accelerates the electron beam during a period when being transmitted through the aberration corrector by a high voltage being impressed across the pair of accelerating electrodes.

14 Claims, 4 Drawing Sheets

U.S. PATENT DOCUMENTS

| | | | |
|---|---|---|---|
| 7,355,175 B2* | 4/2008 | Honda et al. | 250/310 |
| 2004/0119022 A1* | 6/2004 | Sato et al. | 250/396 R |
| 2005/0156117 A1* | 7/2005 | Uno | 250/396 R |
| 2005/0285036 A1* | 12/2005 | Sato et al. | 250/310 |
| 2006/0169895 A1* | 8/2006 | Honda et al. | 250/310 |
| 2006/0175548 A1* | 8/2006 | Kawasaki et al. | 250/310 |
| 2009/0008551 A1* | 1/2009 | Kawasaki et al. | 250/311 |

OTHER PUBLICATIONS

J. Zach and M. Haider, "Aberration Correction in Low Voltage SEM by a Multiple Corrector", Nuclear Instruments and Methods in Physics Research A363 (1995), pp. 316 to 325.

S. Uno, K. Honda, N. Nakamura, M. Matsuya, and J. Zach, "Aberration Correction and Its Automatic Control in Scanning Electron Microscopes", Optik, 116, (2005), pp. 438-448.

* cited by examiner

US 7,718,976 B2

CHARGED PARTICLE BEAM APPARATUS

CLAIM OF PRIORITY

The present invention claims priority from Japanese application JP 2006-169787 filed on Jun. 20, 2006, the content of which is hereby incorporated by reference on to this application.

BACKGROUND OF THE INVENTION

This invention relates to charged particle beam application technologies, and more specifically, to charged particle beam apparatuses, such as a scanning electron microscope (SEM) equipped with an aberration corrector, an electron beam semiconductor inspection system, a critical dimension measurement SEM, and a focused ion beam apparatus.

Since the scanning electron microscope can observe the surface of an object with resolution higher than that of the optical microscope, it is widely used not only as apparatuses for material research but also as industrial apparatuses, such as for dimension measurement of a pattern on a semiconductor wafer that is being advanced in miniaturization in recent years and inspection of surface foreign matters. In specimens (wafers) of the semiconductor industry that use insulators, high resolution of a few nm has become required at a low acceleration voltage of 1 kV or less at which observation can be performed without electrifying the insulators. Since the resolution of the SEM depends on how small an electron beam is focused on a specimen plane, it is determined by diffraction aberration, chromatic aberration and spherical aberration of electron lenses, etc. in addition to the size of an electron source that is reduction imaged by the lenses. Higher-resolution of the SEM has so far been attained by contrivance of an electron optical system, especially by reducing the aberrations by enlarging a reduction ratio of the electron source and optimizing the shape of an objective lens by combining an accelerating electric field and a decelerating electric field.

However, Scherzer proved that an objective lens having rotational symmetry about the optical axis can reduce neither spherical aberration nor chromatic aberration to zero, and accordingly these conventional methods have restrictions in achieving higher resolution from the viewpoint of dimensions of a shape, processing accuracy, material, and a withstand voltage. Then, a method of canceling the aberration of an objective lens with a chromatic and spherical aberration corrector that combined the quadrupole and the octupole was proposed (for example, refer to "H. Rose, Optik 33(1971), pp. 1-24"). In 1995, an SEM equipped with the aberration corrector has been put to practical use by Zach et al. (for example, refer to "J. Zach and M. Haider, Nuclear Instruments and Methods in Physics Research A363 (1995), pp. 316 to 325)").

FIG. 4 shows a schematic diagram of the SEM electron optical system that includes the aberration corrector. Inside the aberration corrector, due to an effect of four-stage quadrupole fields, electrons travel on mutually different fundamental rays in two directions (an x-y coordinate system that rotates together with rotation of fundamental rays about the optical axis caused by a magnetic field lens) perpendicular to the optical axis (z-axis). They are called a fundamental ray x and a fundamental ray y. For example, the SEM electron optical system is so configured that the fundamental ray x forms a line image at a position of a second stage and the fundamental ray y forms a line image at a position of a third stage. If the quadrupole electric field and the quadrupole magnetic field are superposed so that force acting on electrons at the second stage and the third stage each having this line image may become constant, chromatic aberration of the system can be controlled independently in the x-direction and in the y-direction without changing the fundamental rays (for example, refer to "J. Zach and M. Haider, Nuclear Instruments and Methods in Physics Research A363 (1995), pp. 316-325," and "S. Uno, K. Honda, N. Nakamura, M. Matsuya, and J. Zach, Optik 116(2005), pp. 438-448").

SUMMARY OF THE INVENTION

An aberration corrector has multi-stage multipoles therein each stage of which generates a quadrupole field, an octupole field, or a deflection field necessary to align the optical axis, and requires a large number of voltage power supplies and current supplies in order to generate and superpose these fields. Including voltage power supplies for fine adjusting the quadrupole field and the octupole field, one example of the conventional technology described above (for example, "J. Zach and M. Haider, Nuclear Instrument and Methods in Physics Research A363 (1995), pp. 316 to 325)") uses 48 voltage power supplies corresponding to four stages of dodecapoles. Especially, regarding ripple and stability of the voltage power supply, it is said that high accuracy of 1 ppm or less is required. Ripple noise of a voltage impressed to an electrode causes a beam to be deviated laterally at random, enlarging its spot size, which impairs an effect of aberration correction. This influence is large especially in a lowly accelerated beam that is expected to attain higher resolution by chromatic aberration correction.

In order to mitigate this influence of noise of the voltage power supply, there is also a method for adjusting the voltage so that the voltage may become a relatively high correction voltage at the time of observation with twice acceleration by altering efficiency of correction by varying an overall magnification of the whole electron optical system. If the overall magnification is reduced, that is, the spot reduction ratio is made small; the influence of the noise becomes unobservable but a current and a voltage required for chromatic aberration correction and spherical aberration correction increase. Since these current and voltage are restricted by a maximum voltage and a maximum current that can be impressed by control power supplies of the aberration corrector, this method has limitations. Moreover, this technique needs to newly reset reference fundamental rays when the overall magnification is varied according to the influence of the power supply noise, which needs complicated readjustment each time.

This invention is made in view of this situation, and has as its object to provide a charged particle beam apparatus that reduces an influence of noise of a large number of power supplies used in the aberration corrector and thereby makes possible stable high-resolution observation.

In order to attain the above-mentioned object, in this invention, the charged particle beam apparatus is configured to include the chromatic and spherical aberration corrector disposed between a pair of accelerating electrodes, so that electrons accelerated with an acceleration voltage of the aberration corrector pass through the aberration corrector.

A beam deviation angle $\alpha$ in the aberration corrector by pole voltage fluctuation $\Delta V$ is proportional to $\Delta V/V$, where $V$ denotes a voltage given to the pair of the accelerating electrodes. The amount of deviation d of the spot on a specimen plane is proportional to $\alpha \sqrt{V/V_0}$ where $V_0$ denotes landing voltage, and accordingly is proportional to $\Delta V/\sqrt{VV_0}$ as a whole. Since the landing voltage $V_0$ is determined by restrictions of observation conditions of a specimen, such as damages and charge-up, it cannot be selected freely. Since the pole voltage fluctuation $\Delta V$ is related with ripple of the control power supplies of the aberration corrector voltage, a way of setting the ground level to the earth, etc. it is difficult to suppress it to less than a certain fixed fluctuation $\Delta V_{min}$. Because of this, reduction of influence of the pole voltage fluctuation can be attained by increasing the acceleration voltage V in a range in which aberration of the objective lens can be corrected.

Hereafter, there will be enumerated typical examples of configurations of the charged particle beam apparatus by this invention.

(1) A charged particle beam apparatus according to the present invention has a specimen stage for placing and holding the specimen on it, an irradiation optics for scanning primary charged particle beam on to the specimen placed and held on the specimen stage, a detector for detecting a secondary charged particle beam generated by the scanning of the primary charged particle beam, and display means for displaying an output signal of the detector as an image, wherein the irradiation optics has the pair of accelerating electrodes and the aberration corrector that is placed between the pair of accelerating electrodes and corrects aberration of the primary charged particle beam, and accelerates the primary charged particle beam during a period when being transmitted through the aberration corrector by a high voltage being impressed across the pair of accelerating electrodes.

(2) A charged particle beam apparatus that has the specimen stage on which the specimen is placed and held, the irradiation optics for scanning a primary charged particle beam on the specimen placed and held on the specimen stage, the detector for detecting secondary charged particles generated by the scanning of the primary charged particle beam, and the display means for displaying the output signal of the detector as an image, wherein the irradiation optics is equipped with a pair of electrostatic lenses and the aberration corrector that is placed between the pair of electrostatic lenses and corrects aberration of the primary charged particle beam, and accelerates the primary charged particle beam during a period when being transmitted through the aberration corrector by a high voltage being impressed across the pair of electrostatic lenses.

(3) The charged particle beam apparatus according to either of the above-mentioned (1) or (2), wherein the aberration corrector is an aberration corrector capable of correcting either or both of chromatic aberration and spherical aberration.

(4) The charged particle beam apparatus according to either of the above-mentioned (1) or (2), wherein a plurality of multipole element groups for generating the quadrupole field and an octupole field of either or both of an electric field and a magnetic field and axisymmetric accelerating electrodes for a pre-stage and a post stage of the plurality of multipole element groups along the optical axis are built in the aberration corrector.

(5) The charged particle beam apparatus according to the above-mentioned configuration, wherein the aberration corrector is insulated from a column for housing the irradiation optics.

(6) A charged particle beam apparatus that has an SEM column for irradiating an electron beam onto the specimen and making the electron beam scan it, a specimen chamber for housing the specimen stage on which the specimen is placed and held, the detector for detecting secondary electrons generated by the scanning of the electron beam, the display means for displaying the output signal of the detector as an SEM image, and a control unit for controlling component parts including the SEM column, the specimen chamber, and the display means, wherein the SEM column has the pair of accelerating electrodes and the aberration corrector that is placed between the pair of accelerating electrodes and corrects aberration of the electron beam, and accelerates the electron beam during a period when being transmitted through the aberration corrector by a high voltage being impressed across the pair of accelerating electrodes.

(7) A charged particle beam apparatus that has the SEM column for irradiating an electron beam onto the specimen and making the electron beam scan it, the specimen chamber for housing the specimen stage on which the specimen is placed and held, the detector for detecting secondary electrons generated by the scanning of the electron beam, the display means for displaying the output signal of the detector as an SEM image, and the control unit for controlling component parts including the SEM column, the specimen chamber, and the display means, wherein the SEM column has the pair of electrostatic lenses and the aberration corrector that is placed between the pair of electrostatic lenses and corrects aberration of the electron beam, and accelerates the electron beam during a period when being transmitted through the aberration corrector by a high voltage being impressed across the pair of electrostatic lenses.

(8) The charged particle beam apparatus according to either of the above-mentioned (6) or (7), wherein the aberration corrector is an aberration corrector capable of correcting either or both of chromatic aberration and spherical aberration.

(9) The charged particle beam apparatus according to either of the above-mentioned (6) or (7), wherein a plurality of multipole element groups for generating the quadrupole field and an octupole field of either or both of an electric field and a magnetic field and axisymmetric accelerating electrodes for a pre-stage and a post stage of the plurality of multipole element groups along the optical axis are built in the aberration corrector.

(10) The charged particle beam apparatus of the above-mentioned configuration, wherein the aberration corrector is insulated from the SEM column.

According to this invention, the stable charged particle beam apparatus to enable high-resolution observation by reducing the influence by the noise of a large number of power supplies used in the aberration corrector can be realized.

BRIEF DESCRIPTION OF THE DRAWINGS

These and other features, objects and advantages of the present invention will become more apparent from the following description when taken in conjunction with the accompanying drawings wherein.

DETAILED DESCRIPTION OF THE PREFERRED EMBODIMENTS

Hereafter, embodiments will be described taking cases where this invention is applied to the scanning electron microscope for example. This invention is fundamentally applicable to other electron beam application apparatuses and other charged particle beam apparatuses, such as of proton and ion, according to the same way of thinking as that of the embodiments that will be illustrated below, although configurations of lenses and an aberration corrector may be altered according to its type.

First Embodiment

Figure 1:
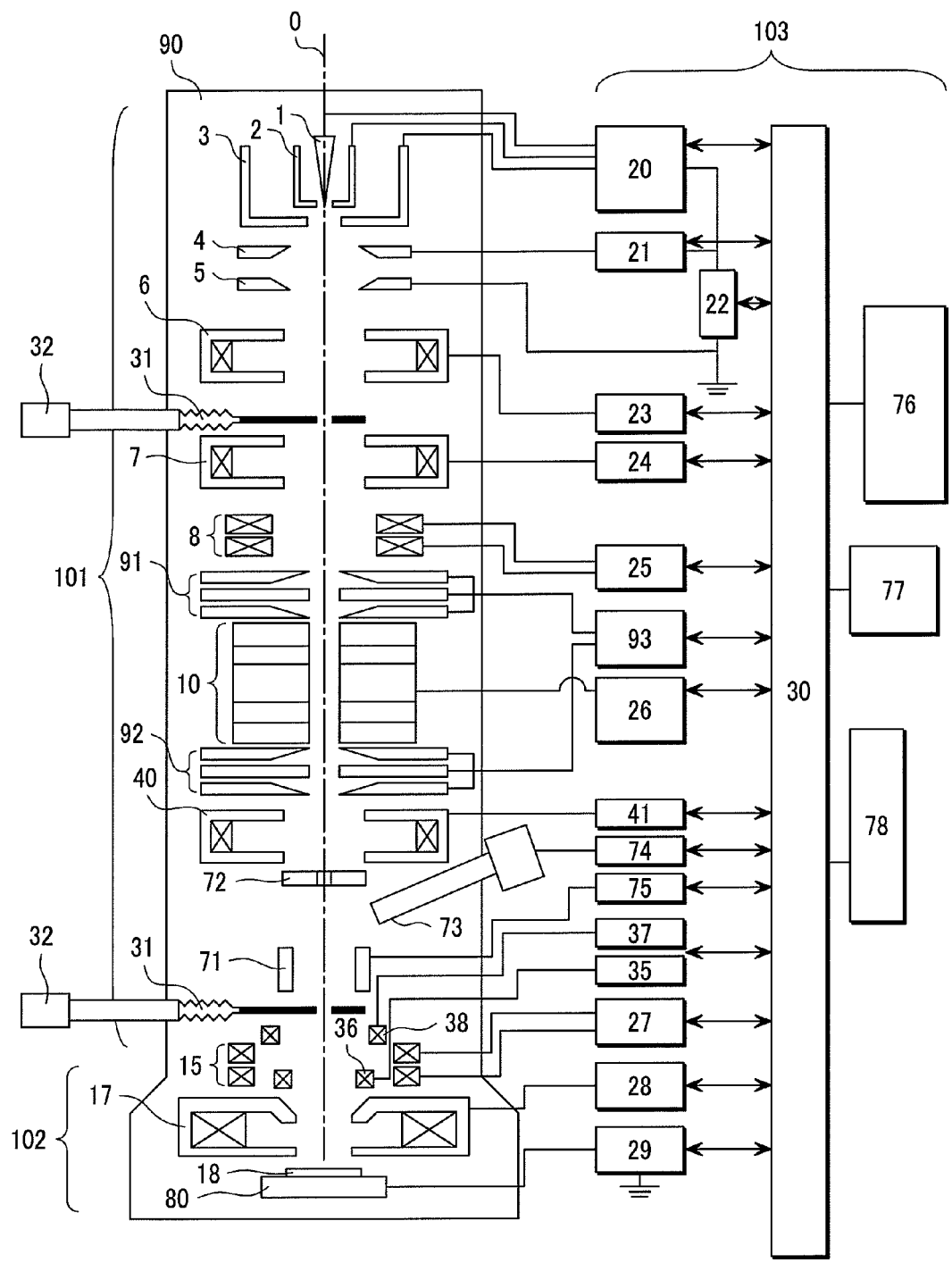
FIG. 1 is a diagram illustrating an outline configuration of a scanning electron microscope as a first embodiment according to this invention.

FIG. 1 shows an outline configuration of a scanning electron microscope as a first embodiment according to this invention. The scanning electron microscope of this embodiment as a whole is constructed with an SEM column 101 that is inside a vacuum chamber 90 and houses an irradiation optics for irradiating an electron beam (primary charged particle beam) onto a specimen or making the electron beam scan it, a specimen chamber 102 for housing a specimen stage, a control unit 103 for controlling component parts of the SEM column 101, the specimen chamber 102, and the like. The control unit 103 has further connections to a data storage 76 for storing predetermined information, a monitor 77 for displaying an acquired image, and an operation console 78 for serving as a man-machine interface between the apparatus and an apparatus user. The console is constructed, for example, with information input means, such as a keyboard and a mouse.

First, constituents inside the SEM column 101 will be explained. A Schottky emitter 1 is an electron source that is made up of a single crystal of tungsten in which oxygen, zirconium, etc. are diffused and uses the Schottky effect. A suppressor electrode 2 and an extraction electrode 3 are provided in proximity to it. The Schottky emitter 1 is made to emit Schottky electrons by heating it while impressing a voltage of about +2 kV between it and the extraction electrode 3. A negative voltage is impressed to the suppressor electrode 2 to suppress electron emission from any other locations than a tip of the Schottky emitter 1. Electrons coming out of a hole of the extraction electrode 3 are accelerated and focused by an electrostatic lens consisting of a first anode 4 and a second anode 5, and enters post-stage constituents along an optical axis 0. The electrons are focused by a first condenser lens 6. The beam diameter is restricted by a movable aperture 31. The electrons are transmitted through a second condenser lens 7, a beam deflector 8, and an upper accelerating electrostatic lens 91, and enter an aberration corrector 10. A high voltage from an high voltage power supply 93 is impressed to the upper accelerating electrostatic lens 91 and a lower decelerating electrostatic lens 92, so that kinetic energy of electrons during a period when being transmitted through the aberration corrector 10 is increased. The beam deflector 8 is so adjusted that an axis of the condenser lens 7 and an axis of the aberration corrector 10 may agree with each other.

On one electrode that is among three electrodes of the electrostatic lens 91 and is nearest above the aberration corrector and one electrode that is among three electrodes of the electrostatic lens 92 and is nearest below the aberration corrector 92, there is impressed voltage that determines energy of an electron passing through the aberration corrector and weakens the influence of power supply noise relatively. Voltage impressed to other pairs of the two electrodes control a degree of opening of the beam and energy after emitting from the aberration corrector. The refractive power of the second condenser lens 7 is so adjusted that the beam may enter the aberration corrector 10 as in the form of a collimated beam or in the form close thereto while it works together with the upper accelerating electrostatic lens 91. One acceleration electrode may be substituted for each of the electrostatic lenses 91, 92. However, in that case, an electrostatic lens action in the vicinity of the acceleration electrode needs to be considered and the second condenser lens 7 and a third condenser lens 40 are worked being linked so that desired irradiation conditions may be obtained.

Hereafter, in this embodiment, the aberration corrector will be explained taking a chromatic and spherical aberration corrector for example. Each stage of the aberration corrector 10 constitutes a quadrupole and an octupole. If a dodecapole electrode (this may also serve as a magnetic pole) is used for this, a bipole, a hexapole, and a dodecapole as well as a quadrupole and an octupole can be formed. In order to electrically correct distortion of a field generated by an assembly error of electrodes and magnetic poles and ununiformity of magnetic pole material, they are used. An electron beam to which the aberration corrector 10 gave chromatic aberration and spherical aberration that was intended to cancel those of an objective lens 17 is decelerated after being transmitted through the lower decelerating electromagnetic lens 92, is focused in the vicinity of an E×B beam deflector 71 by the third condenser lens 40, and subsequently is focused on a specimen 18 by the objective lens 17. A scanning deflector 15 scans the spot on the specimen. In the figure, a reference numeral 38 denotes an objective lens aligner.

The specimen chamber 102 houses a specimen stage 80 having a specimen placement plane on which the specimen 18 is placed and held. Secondary electrons (secondary charged particles) generated by electron irradiation pass through the objective lens 17, strike a reflection plate 72, and generate electrons. The generated electrons are detected by a secondary electron detector 73. It is also possible to bend fundamental rays of secondary electrons generated from the specimen by the E×B beam deflector 71 and guide them directly to the secondary electron detector 73 to be detected or to adjust a position at which the secondary electrons strike the reflection plate 72.

The detected secondary electron signal is captured in a control computer 30 as a luminance signal that is synchronized with the scan. The control computer 30 performs suitable processing on the captured luminance signal information, and displays it on the monitor 77 as an SEM image. Although only one detector is shown in this embodiment, alternatively a plurality of detectors can be arranged so that an image may be acquired selecting energy and an angle distribution of reflection electrons and the secondary electrons. Incidentally, if a secondary electron detector in the form of a disk with a central coaxial hole is arranged above the optical axis 0, the reflection plate 72 is not necessarily required.

The control unit 103 is constructed with an electron gun power supply 20, a control voltage power supply 21 an acceleration voltage power supply 22, a first condenser lens current supply 23, a second condenser lens current supply 24, a deflector power supply 25, control power supplies of the aberration corrector 26, a scanning deflector power supply 27, an objective lens current supply 28, a retarding voltage power supply 29, a movable aperture fine positioning control unit 32, a stigmator current supply 35, an objective lens aligner current supply 37, a secondary electron detector power supply 74, an E×B beam deflector power supply 75, etc. each of which is connected with a corresponding constituent in the SEM column via a signal transmission path, electric wiring, etc.

In such a configuration, the beam deviation angle α by pole voltage fluctuation ΔV in the aberration corrector 10 is proportional to ΔV/V where energy of electron passing through the aberration corrector after being accelerated is designated as eV (−e is charge of electron). Since the amount of deviation d of the spot on a specimen plane is proportional to $\alpha\sqrt{V/V_0}$ where $eV_0$ stands for the landing energy, it is in proportional to $\Delta V /\sqrt{VV_0}$ as a whole. Since $V_0$ is determined by restrictions of damage of the specimen etc., it is possible to attain reduction in the influence of noise of the control power supplies of the aberration corrector by increasing the acceleration voltage V within a range in which aberration of the objective lens can be corrected.

For example, in the case where $V_0$ is set to 1 kV, when the beam passes through the aberration corrector while being accelerated with 2 kV, the influence of noise of the control power supplies of the aberration corrector is suppressed to about 71% (provided that the pole voltage fluctuation ΔV remains unchanged, although the output voltage of the aberration corrector increases in order to maintain the same fundamental ray) as compared to the case where the beam passes therethrough with 1 kV that is not unchanged.

Although in FIG. 1, deceleration is done by inserting the lower deceleration electrostatic lens, the beam may be decelerated to have desired landing energy immediately before the specimen by a retarding voltage being impressed to the specimen.

Second Embodiment

In this embodiment, the case of the critical-dimension-measurement SEM (Scanning Electron Microscope) will be described. As the specimen whose length is measured, there can be enumerated a semiconductor wafer on which a circuit pattern is formed, a chip, or a piece of the specimen that is prepared by cutting a portion from the wafer, etc.

Figure 2:
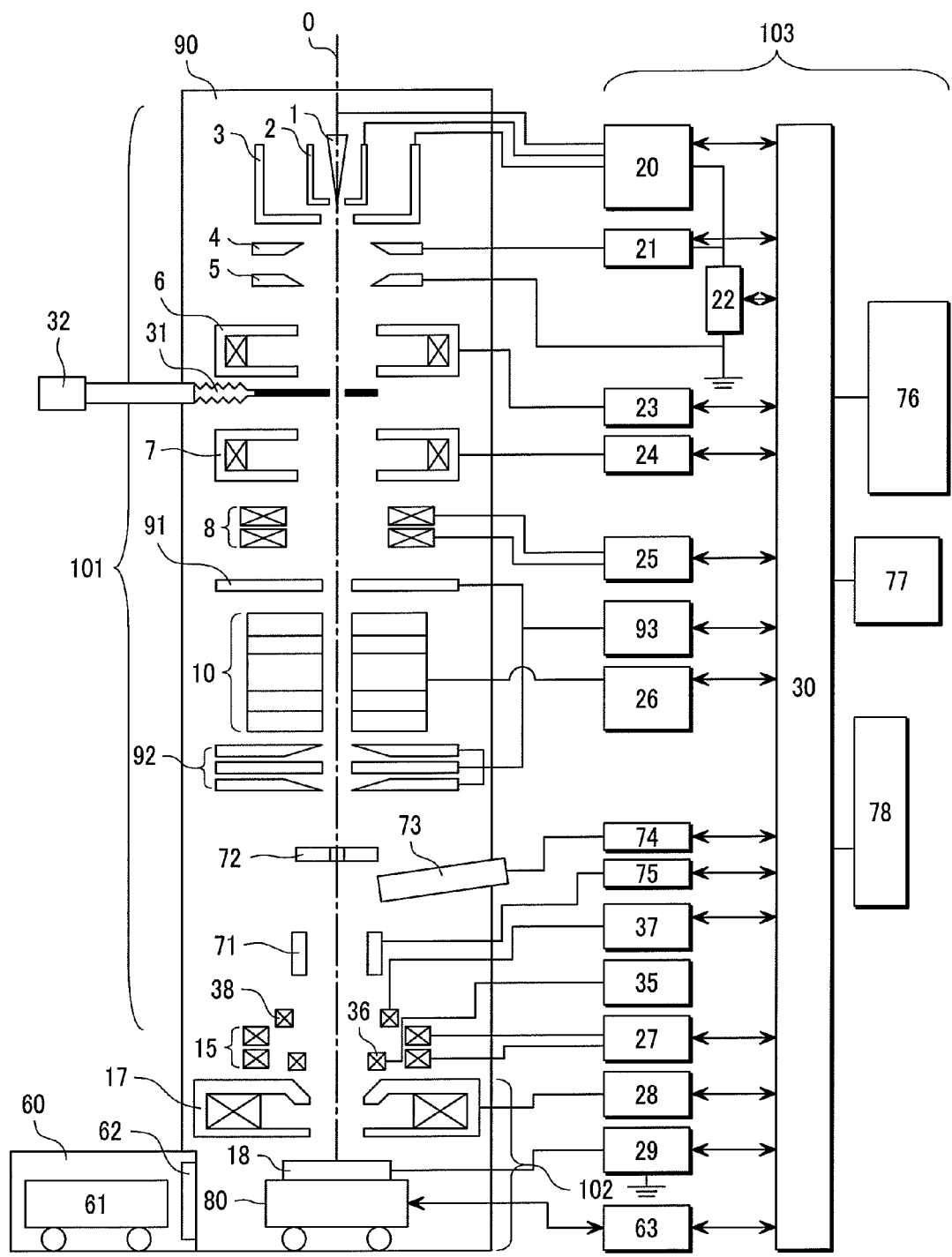
FIG. 2 is a diagram illustrating an outline configuration of a critical-dimension-measurement SEM as a second embodiment according to this invention.

FIG. 2 shows a hardware configuration of the critical-dimension-measurement SEM as a second embodiment according to this invention. That a whole configuration of the critical-dimension-measurement SEM is constructed with the SEM column 101, the specimen chamber 102 for housing a specimen stage, the control unit 103, etc. is the same as the charged particle beam application apparatus explained in the first embodiment, but it has a preparation chamber (load chamber) 60 for introducing a specimen whose length is measured into the apparatus. The preparation chamber 60 and the specimen chamber 102 of a body of the apparatus are partitioned by a gate valve 62. When introducing a specimen into the body, the gate valve opens and the specimen is conveyed to the inside of the specimen chamber by a specimen carrier 61.

Although a rough configuration of the control unit 103 is the same as that of the apparatus of the first embodiment, for the case of the critical-dimension-measurement SEM, the control computer 30 has functions of driving the specimen stage according to a previously inputted recipe, acquiring an image at a predetermined position on the wafer, performing image analysis on the detected secondary electron image signal, and doing length measurement of a predetermined line pattern. Incidentally constituents of the electron optical system stored in the SEM column 101 are the same as those of the apparatus of the first embodiment, and accordingly their explanations are omitted.

Operations of the electron optical system are also essentially the same as those of the charged particle beam apparatus of the first embodiment. However, since the critical-dimension-measurement SEM gives priority to an automatic operative mode, the control computer 30 automatically performs an adjustment operation of the aberration corrector and manipulation of alignment periodically according to a previously inputted procedure. Since in the critical-dimension-measurement SEM a acceleration voltage of the electron gun is not largely altered to observe the specimen unlike the general purpose SEM, adoption of a configuration of transmitting the accelerated beam only in the aberration corrector 10 that is necessary as in this invention gives merits that the withstand voltage of the electron gun can be low and the configuration can be simplified compared with the case where the electron gun is actuated at a high acceleration voltage and a beam is made to enter the aberration corrector 10 as it is.

In addition, by decelerating the beam after coming out of the aberration corrector 10, a magnetizing current of the objective lens 17 can be decreased and power consumption of the whole system can be kept low. Although the application example to the critical-dimension-measurement SEM was shown in this embodiment, the invention is also applicable to semiconductor inspection systems, such as a defect review SEM.

Third Embodiment

Figure 3:
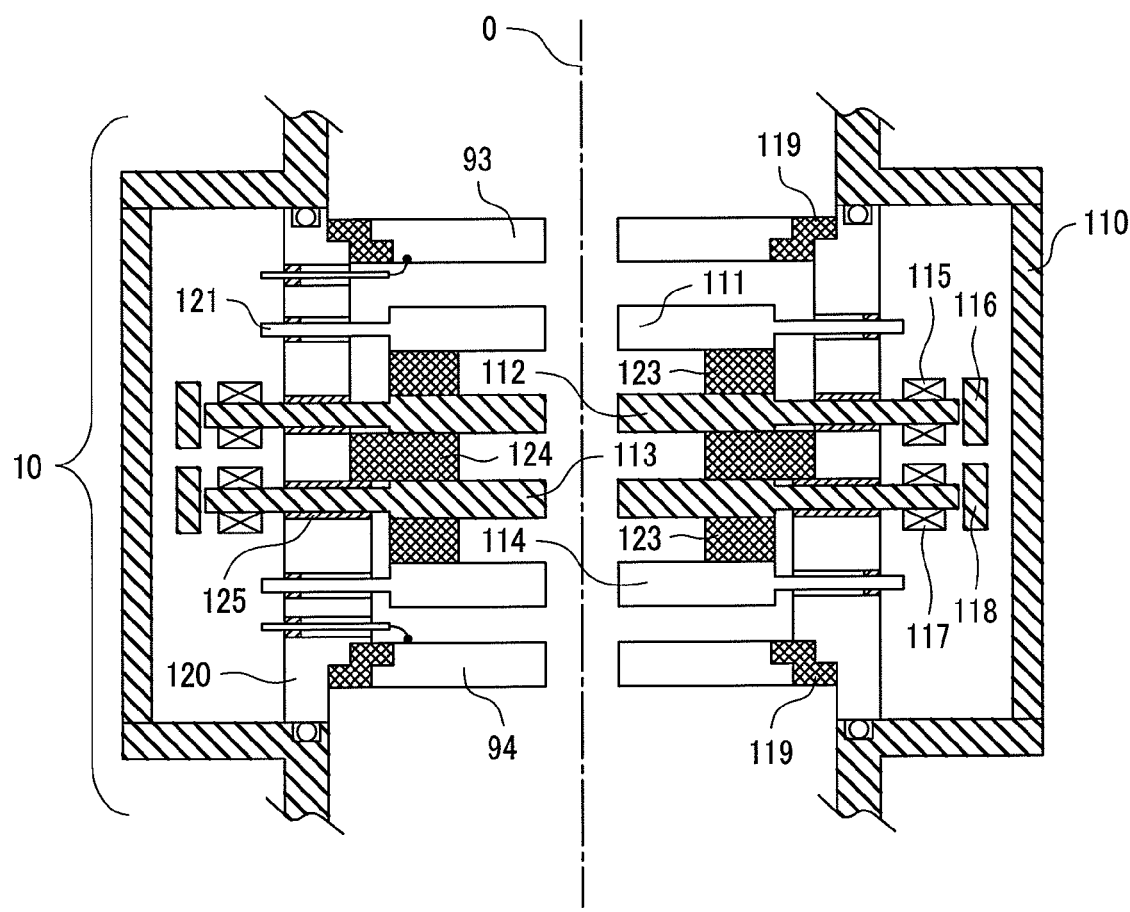
FIG. 3 is a diagram showing an example configuration of an aberration corrector used in this invention.
Figure 4:
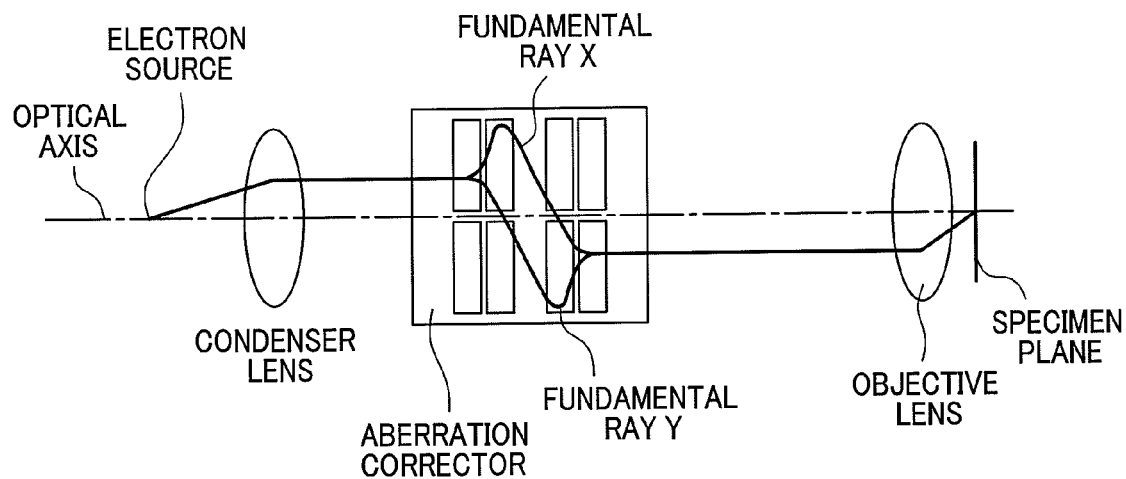
FIG. 4 is a diagram showing an electron optical system including the aberration corrector.

FIG. 3 shows one configuration example of the aberration corrector used in this invention. In this embodiment, a configuration example of four stages of dodecapoles will be explained.

The aberration corrector 10 is configured such that, in a casing 120 made of nonmagnetic metal, the pre-stage accelerating electrode (upper electrode) 93 and a post stage accelerating electrode (lower electrode) 94 are provided along the optical axis through insulator material 119 and an acceleration voltage is impressed to the electrodes 93, 94 via a voltage feedthrough 121 from the vacuum outside. Between the pre- and post stage accelerating electrodes 93, 94, four stages of dodecapoles 111, 112, 113, and 114 are being fixed to the casing 120 through insulators 123, 124. The electrostatic dodecapoles 111, 114 are made of nonmagnetic metal, and a voltage is impressed to them via the voltage feedthroughs 121 from the vacuum outside. The electro-magnetic dodecapoles 112, 113 are made of soft magnetic material, such as a permalloy. An end of each of them projects to the vacuum outside through an insulating sleeve 125 and a vacuum axis seal, and a coil 115 is attached to the end. The dodecapoles 112, 113 are used as magnetic poles and at the same time acts as electrodes by a voltage being impressed to the dodecapoles 112. Dodecapoles of the second and third stages are fixed with soft magnetic metal yokes 116, 118 through insulators (not illustrated), so that a magnetic field generation efficiency on the axis is increased.

Since the casing 120 of the aberration corrector 10 is the nonmagnetic metal, the outside of the aberration corrector 10 is covered with a magnetic shield 110 so that it may not be influenced by an external magnetic field.

A quadrupole field is formed by the dodecapoles 111, 112, 113, and 114. The strengths of the four dodecapoles are so adjusted that the beam may form a line image in the vicinity of a center of the dodecapole 112 and in the vicinity of a center of the dodecapole 113. The chromatic aberration is corrected by superposing an electric field of the quadrupole field and a magnetic field of the quadrupole field in the dodecapoles 112, 113 while maintaining these fundamental rays. Further, the spherical aberration is corrected by generating an octupole field by the dodecapoles 111, 112, 113, and 114 to be superposed on the quadrupole field and adjusting it to a suitable strength. In addition, aberrations of axial comatic aberration, triad astigmatism, etc. are corrected by superposing and adjusting a hexapole to each stage, so that high resolution is obtained.

Fourth Embodiment

Figure 5:
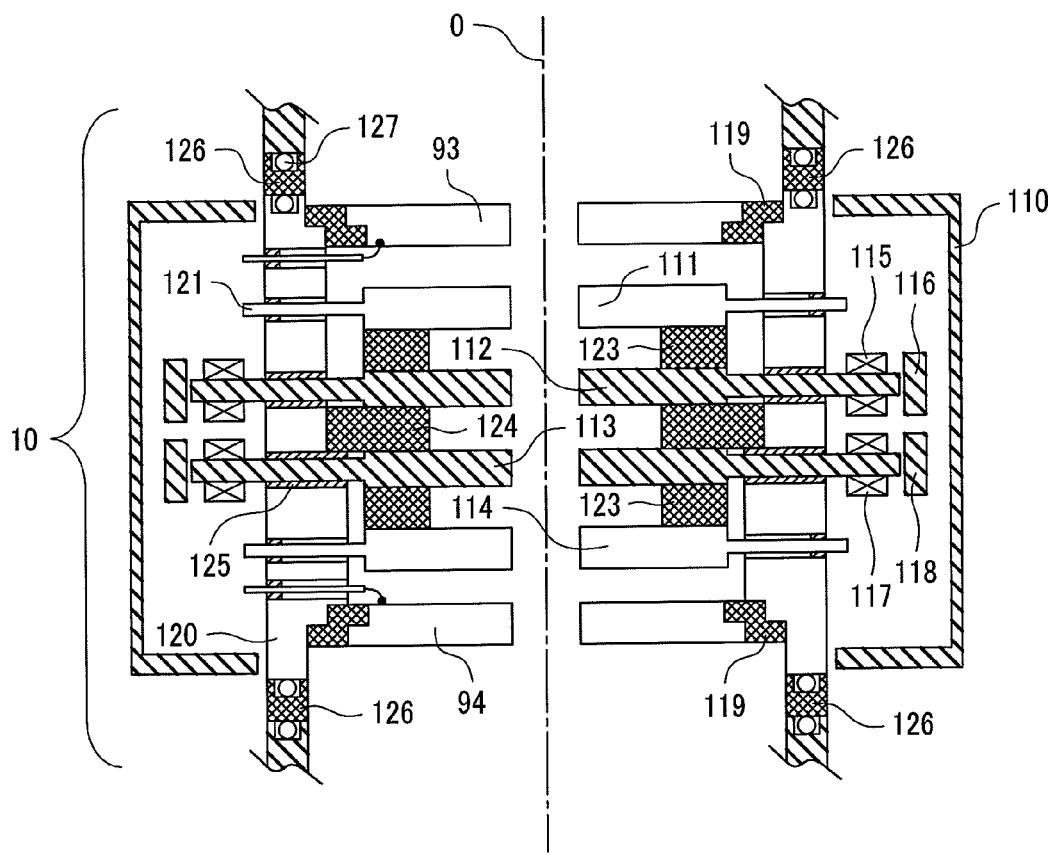
FIG. 5 is a diagram showing another example configuration of the aberration corrector used in this invention.

FIG. 5 shows another configuration example of the aberration corrector. In this embodiment, although a configuration of four stages of dodecapoles in the aberration corrector is the same as that of the third embodiment, it has a structure that insulates (floats) the aberration corrector 10 from the column (microscope body) through an insulated spacer 126. Incidentally, in the figure, a reference numeral 127 denotes a vacuum gasket.

Regarding this aberration corrector 10 floating from the earth, its potential is set by connecting the earth of the control power supplies of the aberration corrector or an earth point of the microscope body with the casing 120 directly via an earth line. Although not illustrated in particular, support of the magnetic shield 110 is done by building a post etc. on the casing 120. In the electron microscope, minute leakage currents from an ion pump, a turbo molecular pump, etc. that are generally used, are flowing into the earth via the column. This current flowing through the column makes a weak magnetic field in the vicinity of the optical axis, which deviates the beam, becoming a factor of image noise. By adopting a configuration as in this embodiment, the current flowing through the column can be cut off. The configuration can eliminate this noise, which is especially effective in an SEM where high resolution is required at low acceleration.

As described in detail above, according to this invention, by transmitting the accelerated beam only through the aberration corrector in the electron optical system for correcting aberration, an influence by noise of a large number of the power supplies used in the aberration corrector can be reduced, and thereby a stable charged particle beam apparatus to enable high-resolution observation can be realized. Moreover, compared with a method whereby an electron gun is made capable of high acceleration, and highly accelerated beam is transmitted through the microscope body and is strongly decelerated near the specimen, so that noise is suppressed, the charged particle beam apparatus is easy to manufacture and power consumption of the whole system can be suppressed low.

Furthermore, this invention has the possibility of being used for the scanning electron microscope, semiconductor inspection systems, the scanning transmission electron microscope, focused ion beam systems, etc.

What is claimed is:

1. A charged particle beam apparatus comprising:
   a specimen stage on which a specimen is placed and held;
   an irradiation optics for scanning a primary charged particle beam on the specimen placed and held on the specimen stage;
   a detector for detecting secondary charged particles generated by the scanning of the primary charged particle beam, and
   display means for displaying an output of the detector as an image,
   wherein:
   the irradiation optics is equipped with a pair of accelerating electrodes and an aberration corrector that is placed between the pair of accelerating electrodes and corrects aberration of the primary charged article beam,
   the primary charged particle beam is accelerated during a period when being transmitted through the aberration corrector by a voltage being impressed across the pair of accelerating electrodes, and
   a plurality of multipole element groups for generating a quadrupole field and an octupole field of either or both of an electric field and a magnetic field and axisymmetric accelerating electrodes for a pre-stage and a post stage of the plurality of multipole element groups along the optical axis are built in the aberration corrector.

2. The charged particle beam apparatus according to claim 1,
   wherein the aberration corrector is an aberration corrector capable of correcting either or both of chromatic aberration and spherical aberration.

3. A charged particle beam apparatus comprising:
   a specimen stage on which a specimen is placed and held;
   an irradiation optics for scanning a primary charged particle beam on the specimen placed and held on the specimen stage;
   a detector for detecting secondary charged particles generated by the scanning of the primary charged particle beam, and
   display means for displaying an output of the detector as an image,
   wherein:
   the irradiation optics is equipped with a pair of accelerating electrodes and an aberration corrector that is placed between the pair of accelerating electrodes and corrects aberration of the primary charged article beam,
   the primary charged particle beam is accelerated during a period when being transmitted through the aberration corrector by a voltage being impressed across the pair of accelerating electrodes,
   a plurality of multipole element groups are built in the aberration corrector for generating a quadrupole field and an octupole field of either or both of an electric field and a magnetic field and axisymmetric accelerating electrodes for a pre-stage and a post stage of the plurality of multipole element groups along the optical axis, and
   the aberration corrector is insulated from a column for housing the irradiation optics.

4. A charged particle beam apparatus comprising:
   a specimen stage on which a specimen is placed and held;
   an irradiation optics for scanning a primary charged particle beam on the specimen placed and held on the specimen stage;
   a detector for detecting secondary charged particles generated by the scanning of the primary charged particle beam; and
   display means for displaying an output signal of the detector as an image,
   wherein:
   the irradiation optics is equipped with a pair of electrostatic lenses and an aberration corrector that is placed between the pair of electrostatic lenses and corrects aberration of the primary charged particle beam,
   the pair of electrostatic lenses accelerates the primary charged particle beam during a period when being transmitted through the aberration corrector by a voltage being impressed across them, and a plurality of multipole element groups for generating a quadrupole field and an octupole field of either or both of an electric field and a magnetic field and axisymmetric accelerating electrodes for a pre-stage and a post stage of the plurality of multipole element groups along the optical axis are built in the aberration corrector.

5. The charged particle beam apparatus according to claim 4,
wherein the aberration corrector is an aberration corrector capable of correcting either or both of chromatic aberration and spherical aberration.

6. A charged particle beam apparatus comprising:
a specimen stage on which a specimen is placed and held;
an irradiation optics for scanning a primary charged particle beam on the specimen placed and held on the specimen stage;
a detector for detecting secondary charged particles generated by the scanning of the primary charged particle beam; and
display means for displaying an output signal of the detector as an image,
wherein:
the irradiation optics is equipped with a pair of electrostatic lenses and an aberration corrector that is placed between the pair of electrostatic lenses and corrects aberration of the primary charged particle beam,
the pair of electrostatic lenses accelerates the primary charged particle beam during a period when being transmitted through the aberration corrector by a voltage being impressed across them,
a plurality of multipole element groups for are built in the aberration corrector generating a quadrupole field and an octupole field of either or both of an electric field and a magnetic field and axisymmetric accelerating electrodes for a pre-stage and a post stage of the plurality of multipole element groups along the optical axis, and
the aberration corrector is insulated from a column for housing the irradiation optics.

7. A charged particle beam apparatus comprising:
an SEM column for irradiating an electron beam onto a specimen and making the electron beam scan it;
a specimen chamber for housing a specimen stage on which the specimen is placed and held;
a detector for detecting secondary electrons generated by the scanning of the electron beam;
display means for displaying an output signal of the detector as an SEM image; and
a control unit for controlling component parts including the SEM column, the specimen chamber, and the display means,
wherein the SEM column has a pair of accelerating electrodes and an aberration corrector that is placed between the pair of accelerating electrodes and corrects aberration of the electron beam, and accelerates the electron beam during a period when being transmitted through the aberration corrector by a voltage being impressed across the pair of accelerating electrodes, and
wherein a plurality of multipole element groups for generating a quadrupole field and an octupole field of either or both of an electric field and a magnetic field and axisymmetric accelerating electrodes for a pre-stage and a post stage of the plurality of multipole element groups along the optical axis are built in the aberration corrector.

8. The charged particle beam apparatus according to claim 7,
wherein the aberration corrector is an aberration corrector capable of correcting either or both of chromatic aberration and spherical aberration.

9. A charged particle beam apparatus comprising:
an SEM column for irradiating an electron beam onto a specimen and making the electron beam scan it;
a specimen stage on which the specimen is placed and held;
a detector for detecting secondary electrons generated by the scanning of the electron beam;
display means for displaying an output of the detector as an SEM image; and
a control unit for controlling component parts including the SEM column, the specimen chamber, and the display means,
wherein:
the SEM column has a pair of electrostatic lenses and an aberration corrector that is placed between the pair of electrostatic lenses and corrects aberration of the electron beam, and accelerates the electron beam during a period when being transmitted through the aberration corrector by a voltage being impressed across the pair of electrostatic lenses,
a plurality of multipole element groups are built in the aberration corrector for generating a quadrupole field and an octupole field of either or both of an electric field and a magnetic field and axisymmetric accelerating electrodes for a pre-stage and a post stage of the plurality of multipole element groups along the optical axis, and
the aberration corrector is insulated from the SEM column.

10. The charged particle beam apparatus according to claim 7,
wherein the control unit has a function of measuring length of a pattern on the specimen by driving the specimen stage and acquiring an SEM image at a predetermined position on the specimen.

11. A charged particle beam apparatus comprising:
an SEM column for irradiating an electron beam onto a specimen and making the electron beam scan it;
a specimen stage on which the specimen is placed and held;
a detector for detecting secondary electrons generated by the scanning of the electron beam;
display means for displaying an output of the detector as an SEM image; and
a control unit for controlling component parts including the SEM column, the specimen chamber, and the display means,
wherein the SEM column has a pair of electrostatic lenses and an aberration corrector that is placed between the pair of electrostatic lenses and corrects aberration of the electron beam, and accelerates the electron beam during a period when being transmitted through the aberration corrector by a voltage being impressed across the pair of electrostatic lenses, and
wherein a plurality of multipole element groups for generating a quadrupole field and an octupole field of either or both of an electric field and a magnetic field and axisymmetric accelerating electrodes for a pre-stage and a post stage of the plurality of multipole element groups along the optical axis are built in the aberration corrector.

12. The charged particle beam apparatus according to claim 11,
wherein the aberration corrector is an aberration corrector capable of correcting either or both of chromatic aberration and spherical aberration.

13. A charged particle beam apparatus comprising:
an SEM column for irradiating an electron beam onto a specimen and making the electron beam scan it;
a specimen stage on which the specimen is placed and held;
a detector for detecting secondary electrons generated by the scanning of the electron beam;
display means for displaying an output of the detector as an SEM image; and
a control unit for controlling component parts including the SEM column, the specimen chamber, and the display means,
wherein:
the SEM column has a pair of electrostatic lenses and an aberration corrector that is placed between the pair of electrostatic lenses and corrects aberration of the electron beam, and accelerates the electron beam during a period when being transmitted through the aberration corrector by a voltage being impressed across the pair of electrostatic lenses,
a plurality of multipole element groups are built in the aberration corrector for generating a quadrupole field and an octupole field of either or both of an electric field and a magnetic field and axisymmetric accelerating electrodes for a pre-stage and a post stage of the plurality of multipole element groups along the optical axis, and
the aberration corrector is insulated from the SEM column.

14. The charged particle beam apparatus according to claim 11,
wherein the control unit has a function of measuring length of a pattern on the specimen by driving the specimen stage and acquiring an SEM image at a predetermined position on the specimen.

* * * * *